(12) United States Patent
Kim et al.

(10) Patent No.: US 10,088,948 B2
(45) Date of Patent: *Oct. 2, 2018

(54) TOUCH PANEL AND METHOD FOR MANUFACTURING THE SAME

(71) Applicant: LG INNOTEK CO., LTD., Seoul (KR)

(72) Inventors: Byung Soo Kim, Seoul (KR); Keun Sik Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/792,383

(22) Filed: Oct. 24, 2017

(65) Prior Publication Data

US 2018/0046315 A1    Feb. 15, 2018

Related U.S. Application Data

(63) Continuation of application No. 15/222,541, filed on Jul. 28, 2016, which is a continuation of application
(Continued)

(30) Foreign Application Priority Data

Jun. 29, 2011    (KR) .................. 10-2011-0064111

(51) Int. Cl.
*G06F 3/0354* (2013.01)
*G06F 3/041* (2006.01)
(Continued)

(52) U.S. Cl.
CPC ............ *G06F 3/0416* (2013.01); *G06F 3/044* (2013.01); *H05K 1/028* (2013.01); *H05K 1/0298* (2013.01);
(Continued)

(58) Field of Classification Search
CPC combination set(s) only.
See application file for complete search history.

(56) References Cited

U.S. PATENT DOCUMENTS

| 4,412,214 A | 10/1983 | Tanaka et al. |
| 4,686,332 A | 8/1987 | Greanias et al. |

(Continued)

FOREIGN PATENT DOCUMENTS

| CN | 101727249 A | 6/2010 |
| CN | 201689397 U | 12/2010 |

(Continued)

OTHER PUBLICATIONS

International Search Report in International Application No. PCT/KR2012/005200, filed Jun. 29, 2012.
(Continued)

*Primary Examiner* — Van N Chow
(74) *Attorney, Agent, or Firm* — Saliwanchik, Lloyd & Eisenschenk

(57) ABSTRACT

Disclosed are a touch panel and a method for manufacturing the same. A touch panel can include a substrate, a transparent electrode base on the substrate, a first transparent electrode on the transparent electrode base and extending in a first direction, and a second transparent electrode on the transparent electrode base and extending in a second direction. A method of manufacturing a touch panel can include preparing a substrate and a transparent electrode base, forming a transparent electrode over the transparent electrode base, and forming an electrode material over the transparent electrode base.

20 Claims, 5 Drawing Sheets

Related U.S. Application Data

No. 14/130,259, filed as application No. PCT/KR2012/005200 on Jun. 29, 2012, now Pat. No. 9,433,089.

(51) Int. Cl.
*G06F 3/044* (2006.01)
*H05K 1/02* (2006.01)

(52) U.S. Cl.
CPC .............. *G06F 2203/04102* (2013.01); *G06F 2203/04103* (2013.01); *G06F 2203/04104* (2013.01); *G06F 2203/04111* (2013.01); *H05K 2201/0145* (2013.01); *H05K 2201/05* (2013.01); *H05K 2201/10128* (2013.01)

(56) References Cited

U.S. PATENT DOCUMENTS

| | | | |
|---|---|---|---|
| 6,266,032 B1 | 6/2001 | Watanabe et al. | |
| 6,436,265 B1 * | 8/2002 | Shimada | G02B 3/0012 205/122 |
| 6,556,515 B1 | 4/2003 | Sekiguchi | |
| 6,787,253 B2 | 9/2004 | Iwabuchi et al. | |
| 8,866,775 B2 | 10/2014 | Xie et al. | |
| 8,907,919 B2 | 12/2014 | Herman | |
| 9,519,387 B2 | 12/2016 | Kim et al. | |
| 9,529,222 B2 | 12/2016 | Teranishi et al. | |
| 2008/0252612 A1 | 10/2008 | Yu | |
| 2009/0015747 A1 | 1/2009 | Nishizawa et al. | |
| 2009/0096754 A1 | 4/2009 | Hinata | |
| 2009/0273570 A1 | 11/2009 | Degner et al. | |
| 2010/0117975 A1 | 5/2010 | Cho | |
| 2010/0245246 A1 | 9/2010 | Rosenfeld et al. | |
| 2011/0102363 A1 | 5/2011 | Yang et al. | |
| 2011/0205168 A1 | 8/2011 | Jun | |
| 2011/0207055 A1 | 8/2011 | Jun et al. | |
| 2011/0273383 A1 | 11/2011 | Jeon et al. | |
| 2012/0241199 A1 | 9/2012 | Kobayashi et al. | |
| 2013/0194220 A1 | 8/2013 | Lee et al. | |

FOREIGN PATENT DOCUMENTS

| | | |
|---|---|---|
| CN | 101963864 A | 2/2011 |
| CN | 101976164 A | 2/2011 |
| JP | 2004-240548 A | 8/2004 |
| JP | 2008090517 A | 4/2008 |
| JP | 2010061425 A | 3/2010 |
| JP | 2010257442 A | 11/2010 |
| JP | 2011059834 A | 3/2011 |
| JP | 2011070536 A | 4/2011 |
| JP | 2011095903 A | 5/2011 |
| KR | 10-2008-0096976 A | 11/2008 |
| KR | 10-2009-0037802 A | 4/2009 |
| KR | 10-0942763 B1 | 2/2010 |
| KR | 10-2010-0124365 A | 11/2010 |
| TW | 2011-16884 A | 5/2011 |
| TW | 2011-35566 A | 10/2011 |
| TW | 2011-42680 A | 12/2011 |
| TW | 2012-03043 A | 1/2012 |
| WO | WO-2009/134727 A1 | 11/2009 |
| WO | WO-2010117664 A2 | 10/2010 |
| WO | WO-2011070801 A1 | 6/2011 |

OTHER PUBLICATIONS

Office Action dated Aug. 7, 2014 in Taiwanese Application No. 101123571.
Extended European Search Report dated Feb. 23, 2015 in European Application No. 12805392.3.
Office Action dated Dec. 1, 2015 in Chinese Application No. 201280042477.5.
Office Action dated Jun. 7, 2016 in Japanese Application No. 2014-518811.
Office Action dated Jun. 1, 2016 in Chinese Application No. 201280042477.5.
Office Action dated Nov. 17, 2016 in Chinese Application No. 201280042477.5.
Office Action dated Oct. 18, 2016 in Japanese Application No. 2014518811.
Japanese Office Action dated Feb. 24, 2017 in Japanese Application No. 2014518811.

* cited by examiner

TOUCH PANEL AND METHOD FOR MANUFACTURING THE SAME

CROSS-REFERENCE TO RELATED APPLICATION

This application is a continuation of U.S. application Ser. No. 15/222,541, filed Jul. 28, 2016; which is a continuation of U.S. application Ser. No. 14/130,259, filed Jun. 5, 2014, now U.S. Pat. No. 9,433,089, issued Aug. 30, 2016; which is the U.S. national stage application of International Patent Application No. PCT/KR2012/005200, filed Jun. 29, 2012; which claims priority to Korean Patent Application No. 10-2011-0064111, filed Jun. 29, 2011, which are hereby incorporated by reference in their entirety.

BACKGROUND

Technical Field

The disclosure relates to a touch panel and a method for manufacturing the same.

Background Art

Recently, touch panels, which perform input functions through the touch of an image displayed on a display device by an input device such as a stylus pen or a hand, have been applied to various electronic appliances.

Touch panels can be mainly classified as resistive touch panels or capacitive touch panels. In a resistive touch panel, glass is shorted with an electrode due to the pressure of the input device so that a touch point is detected. In a capacitive touch panel, the variation in capacitance between electrodes is detected when a finger of the user touches the capacitive touch panel, so that the touch point is detected.

Multi-touch is available in a capacitive touch panel. Multi-touch is a technology in which several touch points can be simultaneously recognized, and allows a user to carry out more various manipulations when compared to a typical technology of recognizing only one touch point. Different from a conventional touch scheme requiring additional manipulations through auxiliary buttons to perform various functions (e.g., because only the position variation can be input through a touch), the reaction of a device to the touch can be specified according to the number of detected touch points, and predetermined manipulations through the detection of the intervals between the touch points can be performed. Accordingly, a user can more intuitively and conveniently manipulate the touch panel.

BRIEF SUMMARY

Technical Problem

The embodiment provides a touch panel capable of reducing the thickness thereof and reducing a bezel and a method for manufacturing the same. Recently, there has been a need in the art for a touch panel having curved glass and a multi-touch function Technical Solution According to an embodiment of the subject invention, a touch panel can include a substrate, a transparent electrode base on the substrate (e.g., provided on any surface of the substrate and/or provided thereon with a transparent electrode), a first transparent electrode provided on the transparent electrode base (e.g., any surface of the transparent electrode base) and extending in a first direction, and a second transparent electrode provided on the transparent electrode base (e.g., any surface of the transparent electrode base) and extending in a second direction (e.g., a direction to cross the first transparent electrode).

According to another embodiment of the subject invention, a method for manufacturing a touch panel can include preparing a substrate and a transparent electrode base, forming a transparent electrode over the transparent electrode base, and depositing an electrode material over the transparent electrode base. The method can further include forming an anti-reflective layer over the transparent electrode base.

Advantageous Effects

According to embodiments of the subject invention, the first and second transparent electrodes can be formed on a transparent electrode base (e.g., in a PET film serving as the transparent electrode base), and the flexibility of the touch panel can be ensured.

The transparent electrode can include the first and second transparent electrodes. The first and second transparent electrodes can be provided at different layers. Accordingly, touches can be more sensitively sensed, so that the accuracy of touch sensing can be improved. In addition, a touch panel having a multi-touch function, which has been recently spotlighted, can be provided. In a particular embodiment, a touch panel having a multi-touch function and including curved glass can be provided.

According to an embodiment of the present invention, the transparent electrode can be formed such that it is not directly formed on the substrate, and because of this, the electrical characteristic of the transparent electrode can be easily controlled. In addition, since the transparent electrode can be formed on the transparent electrode base, the touch panel can have a thin thickness.

The transparent electrode base can include a hard coating layer. The hard coating layer and the insulating layer can be subject to index matching. The characteristics such as the transmittance, the reflectance, and the chrominance (b*, yellowish) can be optimized due to the index matching. In addition, the first and second transparent electrodes including a transparent conductive material can be in the invisible state through index matching. Therefore, the visibility of the display device employing the touch panel can be improved.

In an embodiment, a touch panel can include a substrate comprising a curved surface. Accordingly, a display device employing the touch panel according to the embodiment can provide visual stability due to the curved surface. In addition, the touch sensitivity of the touch panel can be enhanced. In particular, when the touch panel is applied to a cellular phone, the usability of the cellular phone can be improved. When a user holds the cellular phone in the hand of the user, the cellular phone provides superior grip so that the user can feel stability for the cellular phone. In addition, when the user talks with the counterpart by using the cellular phone, the cellular phone adheres to the face line of the user, so that the usability of the cellular phone can be improved.

In an embodiment of a method for manufacturing a touch panel, a narrow dummy area can be realized by forming the wire electrode having a thin line width. Accordingly, the area of the effective area is increased, and various designs can be ensured.

DETAILED DESCRIPTION

Figure 1:
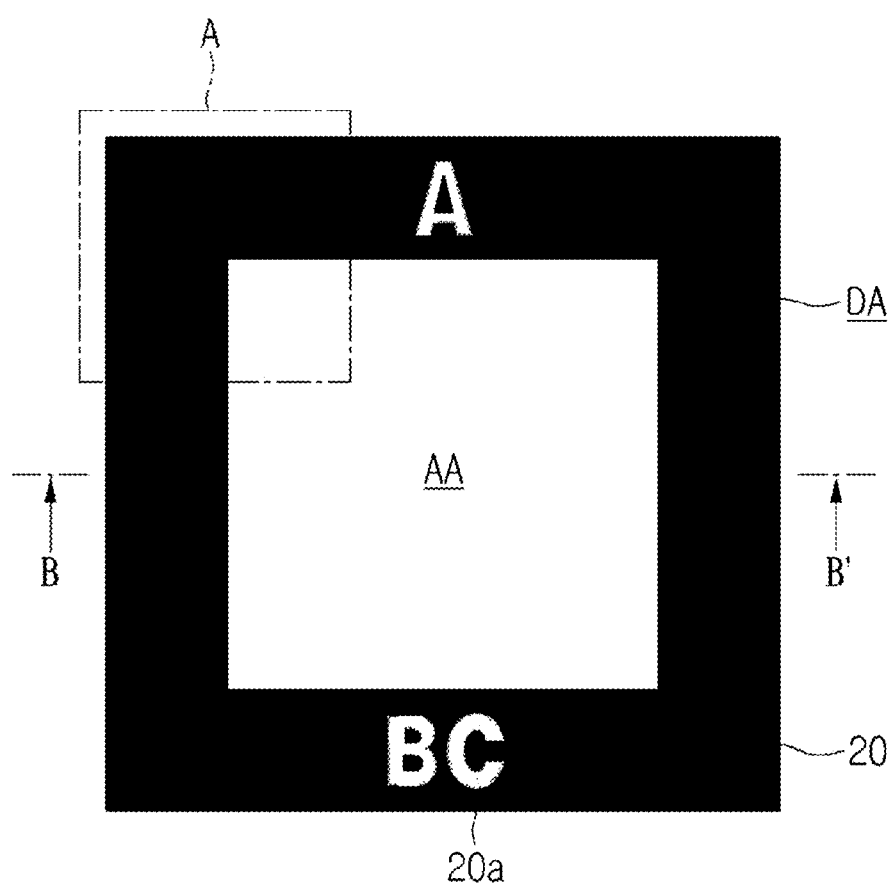
FIG. 1 is a plan view schematically showing a touch panel according to an embodiment of the subject invention.

In the description of the embodiments, it will be understood that, when a layer (or film), a region, a pattern, or a structure is referred to as being "on" or "under" another layer (or film), another region, another pad, or another pattern, it can be "directly" or "indirectly" on the other layer (or film), region, pad, or pattern, or one or more intervening layers may also be present. Such a position of the layer has been described with reference to the drawings.

The thickness and size of each layer (film), region, pattern, or structure shown in the drawings may be exaggerated, omitted or schematically drawn for the purpose of convenience or clarity. In addition, the size of each layer (film), region, pattern, or structure does not utterly reflect an actual size.

Hereinafter, embodiments of the subject invention will be described in detail with reference to accompanying drawings.

A touch panel according to a first embodiment will be described below with reference to FIGS. 1 to 3. FIG. 1 is a plan view schematically showing a touch panel according to an embodiment, FIG. 2 is an enlarged plan view of a part A of FIG. 1, and FIG. 3 is a sectional view taken along line B-B' of FIG. 1.

Figure 2:
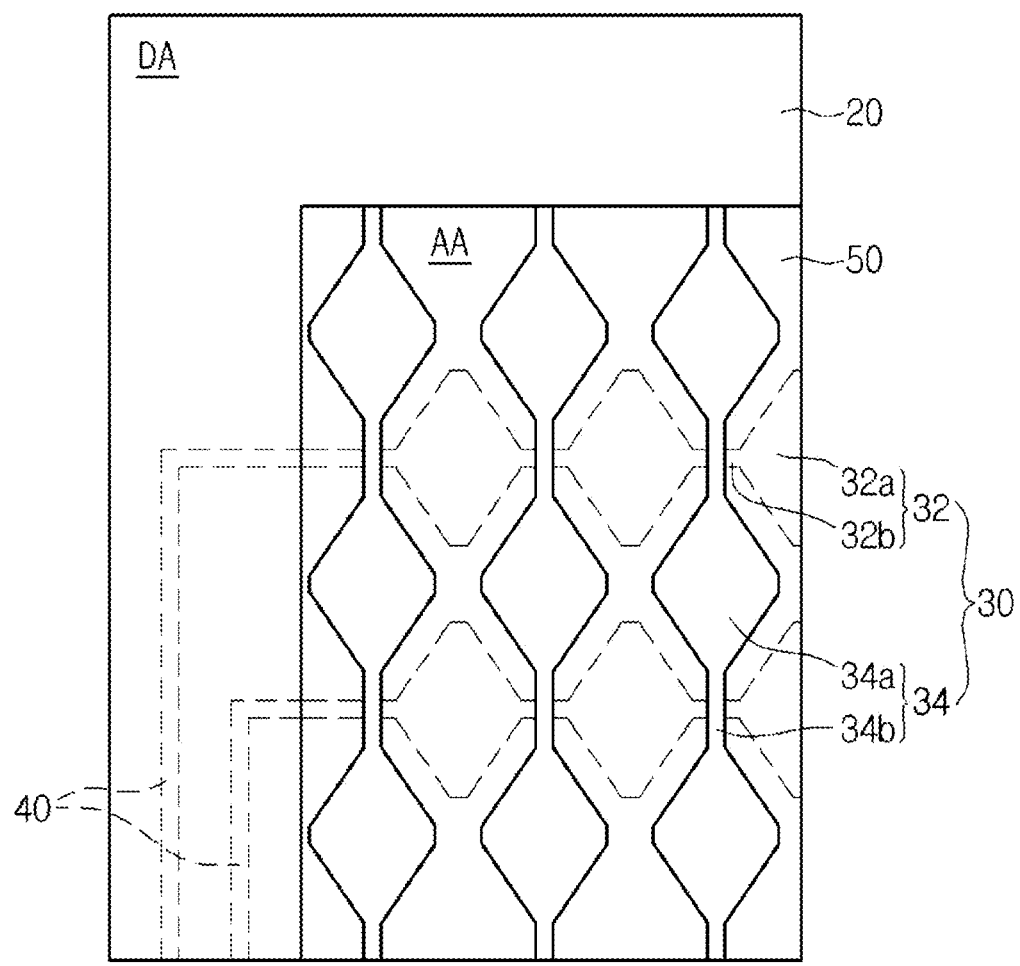
FIG. 2 is an enlarged plan view of a part A of FIG. 1.
Figure 3:
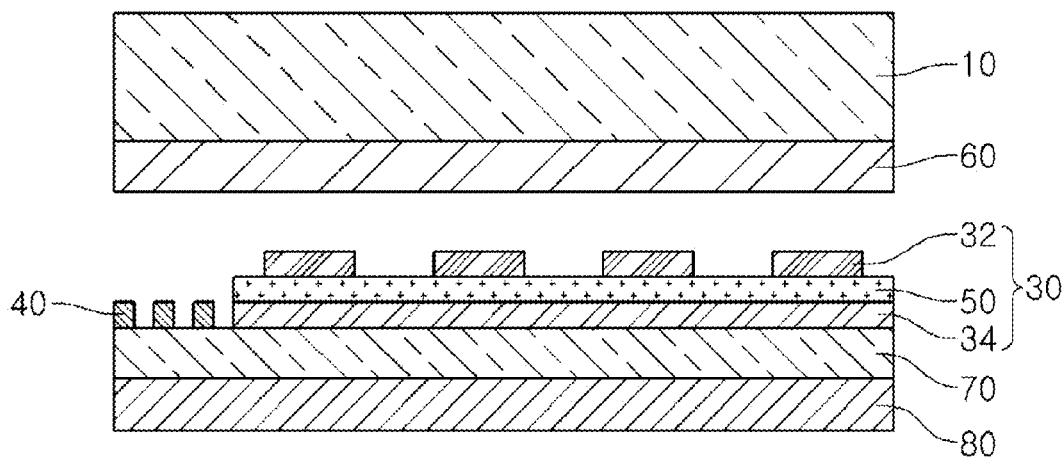
FIG. 3 is a sectional view taken along line B-B' of FIG. 1.

Referring to FIGS. 1 to 3, in an embodiment, a touch panel 100 can be defined by an effective area AA, in which the position of an input device is detected, and a dummy area DA provided at an outer portion of the effective area AA.

The effective area AA can be provided therein with a transparent electrode 30 to detect the input device. In addition, the dummy area DA can be provided therein with a wire 40 connected to the transparent electrode 30 and a printed circuit board to connect the wire 40 to an external circuit (not shown). The dummy area DA can be provided therein with an outer dummy layer 20. A logo 20a may be formed in the outer dummy layer 20. Hereinafter, characteristics of the touch panel 100 will be described in more detail.

The touch panel 100 according to the first embodiment can include one or more of: a substrate 10; an outer dummy layer 20; an optically clear adhesive 60; a transparent electrode 30; a wire 40; an insulating layer 50; a transparent electrode base 70; and an anti-reflective layer 80.

The substrate 10 can be any suitable material known in the art, for example, a glass substrate or a plastic substrate, though embodiments are not limited thereto.

In an embodiment, the substrate 10 can include a curved surface (e.g., curved glass). That is, at least one surface of the substrate 10 can include a curved surface. The curved surface can have a concave shape. Alternatively, the curved surface can have a convex shape.

Accordingly, a display device employing the touch panel 100 according to the embodiment can provide visual stability due to the curved surface. In addition, the touch sensitivity of the touch panel 100 can be enhanced. In particular, when the touch panel 100 is applied to a cellular phone, the usability of the cellular phone can be improved. When a user holds the cellular phone in the hand of the user, the cellular phone provides superior grip so that the user can feel stability for the cellular phone. In addition, when the user talks with the counterpart by using the cellular phone, the cellular phone adheres to the face line of the user, so that the usability of the cellular phone can be improved.

In an embodiment, the optically clear adhesive (OCA) 60 can be interposed between the substrate 10 and the transparent electrode base 70. The OCA 60 can bond the substrate 10 with the transparent electrode base 70. The OCA 60 can bond the substrate 10 with the transparent electrode base 70 without greatly lowering the light transmittance of the touch panel 100.

The transparent electrode base 70 can be positioned on the substrate 10 (e.g., on one surface of the substrate). The transparent electrode base 70 can be, for example, a poly (ethylene terephthalate) (PET) film, though embodiments are not limited thereto. The transparent electrode base 70 can include various materials that may constitute the transparent electrode 30.

The transparent electrode 30 can include first and second transparent electrodes 32 and 34.

In an embodiment, the first and second transparent electrodes 32 and 34 can include sensor parts 32a and 34a to detect the touch of an input device (e.g., a finger of a user), and connection parts 32b and 34b connecting the sensor parts 32a and 34a. The connection part 32b of the first transparent electrode 32 can connect the sensor part 32a in a first direction (shown as left and right directions in FIG. 2), and the connection part 34b of the second transparent electrode 34 can connects the sensor part 34a in a second direction (shown as up and down directions in FIG. 2).

The transparent electrode 30 can have various shapes to detect the touch of the input device (e.g., the finger of a user).

The transparent electrode 30 can include a transparent conductive material allowing electricity to flow without interrupting the transmission of light. To this end, the transparent electrode 30 can include various materials such as metallic oxide including indium tin oxide, indium zinc oxide, copper oxide, tin oxide, zinc oxide, or titanium oxide, a carbon nano-tube (CNT), and a conductive polymer material, though embodiments are not limited thereto.

In an embodiment, the first and second transparent electrodes 32 and 34 can be positioned on the same plane of the transparent electrode base 70. The second transparent electrode 34 can be provided on one surface of the transparent electrode base 70, and the first transparent electrode 32 can be provided on the second transparent electrode 34.

In an embodiment, the first and second transparent electrodes 32 and 34 can be formed in a PET film serving as the transparent electrode base 70, thereby ensuring the flexibility of the touch panel 100.

According to the related art, the transparent electrode is directly formed on the substrate 10 in order to reduce the thickness of a touch panel. However, if the substrate 10 were to have a curved surface, the control of the electrical characteristic of the transparent electrode provided on a curved surface part would be difficult.

According to embodiments of the present invention, since the transparent electrode may not be directly formed on the substrate 10, the electrical characteristic of the transparent electrode can be easily controlled. In addition, since the transparent electrode 30 can be formed on the transparent electrode base 70, the touch panel can be maintained at a thin thickness.

Next, in an embodiment, the insulating layer 50 can be interposed between the first and second transparent electrodes 32 and 34. In other words, the insulating layer 50 can be provided throughout the entire surface of the second transparent electrode 34. Therefore, the first transparent electrode 32 can be prevented from being electrically shorted with the second transparent electrode 34.

The insulating layer 50 can include, for example, a metallic oxide such as a silicon oxide, polymer, and acrylic resin, though embodiments are not limited thereto.

The first and second transparent electrodes 32 and 34 can be provided at different layers while interposing the insulating layer 50 therebetween, thereby more sensitively sensing touches. Accordingly, the accuracy of touch sensing can be improved. In addition, a touch panel having a multi-touch function, which has been recently spotlighted, may be provided. In particular, a touch panel having a multi-touch function and including curved glass may be provided. The multi-touch is a technology, in which several touch points can be simultaneously recognized, can allow a user to carry out more manipulations compared to a typical technology of recognizing only one touch point. Different from a conventional touch scheme requiring additional manipulations through auxiliary buttons to perform various functions because only the position variation can be input through a touch, the reaction of a device to the touch can be specified according to the number of detected touch points, and predetermined manipulations through the detection of the intervals between the touch points can be performed. Accordingly, the user can more intuitively and conveniently manipulate the touch panel.

In an embodiment, the transparent electrode base 70 can include a hard coating layer (not shown). The hard coating layer and the insulating layer 50 can be subject to the index matching. Characteristics, such as the transmittance, the reflectance, and the chrominance (b*, yellowish), can be optimized due to the index matching. In addition, the first and second transparent electrodes including a transparent conductive material can be in the invisible state through index matching. Therefore, the visibility of the display device employing the touch panel 100 can be improved.

If the input device (e.g., a finger) is touched on the touch panel 100, the difference in capacitance can be made in a portion touched by the input device, and the touched portion having the difference in capacitance can be detected as a touch point.

The dummy area DA of the substrate 10 can be provided therein with the wire 40 connected to the transparent electrode 30, and the printed circuit board (not shown) connected to the wire 40. Since the wire 40 is provided in the dummy area DA, the wire 40 can include metal representing superior electrical conductivity. The printed circuit board can have various forms. For example, the printed circuit board can be a flexible printed circuit board (FPCB), though embodiments are not limited thereto.

In certain embodiments, the anti-reflective layer 80 can be present and reduces the reflectance of visible-band light in order to inhibit the glare caused by the reflection and/or inhibit a phenomenon in which a screen image is not viewed. In other words, the anti-reflective layer 80 can provide superior resolution by effectively reducing a bad influence caused by the reflection and can improve visibility. In addition, the transmittance of the touch panel 100 can be improved to at least 90%, preferably, at least 92%. In addition, the transmittance of the touch panel 100 can be improved up to 99%.

The anti-reflective layer 80 can include an oxide or a fluoride having a refractive index of about 1.35 to about 2.7, though embodiments are not limited thereto. The refractive index range can be determined suitably for the anti-reflection. The anti-reflective layer 80 can be formed by stacking materials representing different refractive indexes in one or more layers.

The anti-reflective layer 80 can be formed in contact with the transparent electrode base 70, so that the thickness of the touch panel 100 can be reduced.

Although not shown, a scattering prevention film can be formed to cover the transparent electrode 30 and the wire 40. The scattering prevention film can inhibit fragments from being scattered when the touch panel 100 is broken due to the impact. The scattering prevention film can include various materials in various structures.

Hereinafter, a touch panel 200 according to a second embodiment will be described in more detail with reference to FIG. 4. In the following description, the details of structures and components the same as those described above or extremely similar to those described above will be omitted except for structures and components different from those described above for the purpose of clear and simple explanation.

Figure 4:
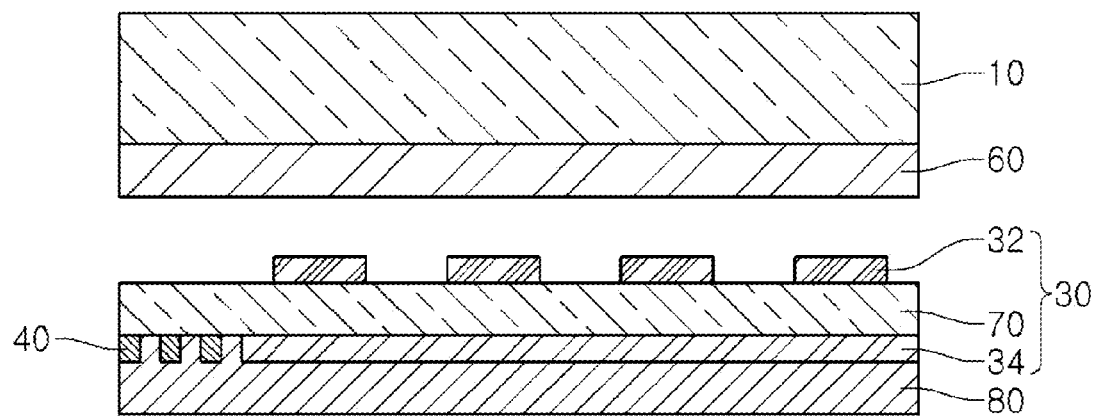
FIG. 4 is a sectional view showing a touch panel according to a second embodiment.

FIG. 4 is a sectional view showing a touch panel 200 according to the second embodiment.

Referring to FIG. 4, in a touch panel 200 according to the second embodiment, the first and second transparent electrodes 32 and 34 can be provided on different surfaces while interposing the transparent electrode base 70 therebetween. For example, the first transparent electrode 32 can be provided on a top surface of the transparent electrode base 70, and the second transparent electrode 34 can be provided on a bottom surface of the transparent electrode base 70.

The transparent electrode base 70 can prevent the first transparent electrode 32 from being electrically shorted with the second transparent electrode 34. Accordingly, an additional insulating layer may be omitted.

According to the related art, since only one transparent electrode is formed on the transparent electrode base 70, a two-layer capacitive touch panel requires at least two transparent electrode bases 70 and a plurality of OCAs 60 used to bond the transparent electrodes bases 70 with each other. Accordingly, the thickness of the touch panel is increased, and the transmittance and the visibility are degraded.

According to embodiments of the present invention, both the first and second transparent electrodes 32 and 34 can be formed on one transparent electrode base 70. Accordingly, the problem can be solved.

In addition, the first and second transparent electrodes 32 and 34 can be provided at different layers about the transparent electrode base 70, thereby more sensitively sensing touches. Accordingly, the accuracy of touch sensing can be improved.

Hereinafter, a touch panel 300 according to a third embodiment will be described in more detail with reference to FIG. 5. In the following description, the details of structures and components the same as those of the first embodiment or extremely similar to those of the first embodiment will be omitted except for only structures and components different from those of the first embodiment for the purpose of clear and simple explanation.

Figure 5:
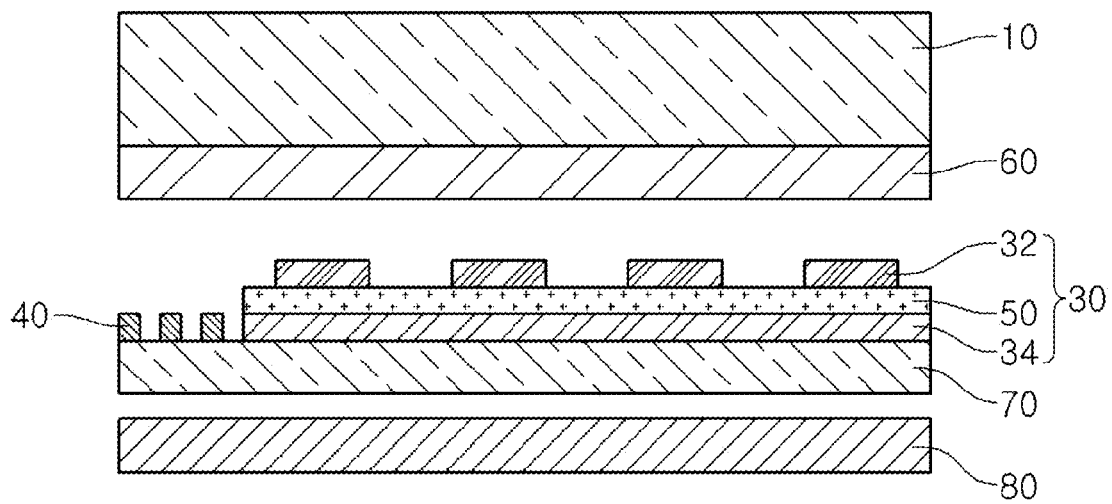
FIG. 5 is a sectional view showing a touch panel according to a third embodiment.

FIG. 5 is a sectional view showing a touch panel 300 according to the third embodiment.

Referring to FIG. 5, in a touch panel 300 according to the third embodiment, the anti-reflective layer 80 can include an anti-reflective film. In other words, the anti-reflective layer 80 can be provided in the form of a film. The touch panel 300 according to the third embodiment can be the same as the touch panel 100 according to the first embodiment except that the anti-reflective layer 80 is provided in the form of a film.

Hereinafter, a touch panel 400 according to a fourth embodiment will be described in more detail with reference to FIG. 6. In the following description, the details of structures and components the same as those of the second embodiment or extremely similar to those of the second embodiment will be omitted except for only structures and components different from those of the second embodiment for the purpose of clear and simple explanation.

Figure 6:
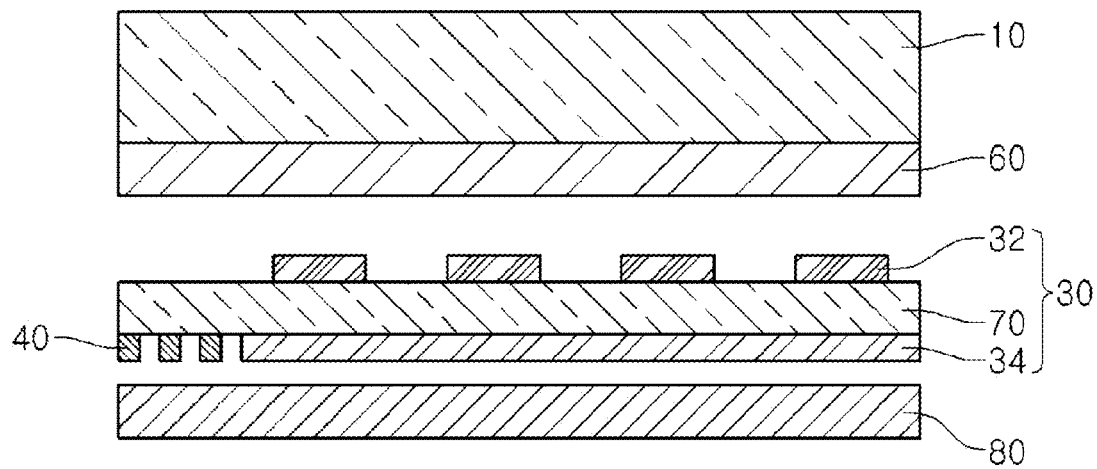
FIG. 6 is a sectional view showing a touch panel according to a fourth embodiment.

FIG. 6 is a sectional view showing a touch panel 400 according to the fourth embodiment.

Referring to FIG. 6, in a touch panel 400 according to the fourth embodiment, the anti-reflective layer 80 can include an anti-reflective film. In other words, the anti-reflective layer 80 can be provided in the form of a film. The touch panel 400 according to the fourth embodiment can be the same as the touch panel 200 according to the second embodiment except that the anti-reflective layer 80 is provided in the form of a film.

Hereinafter, a method for manufacturing a touch panel according to an embodiment of the subject invention will be described with reference to FIG. 7.

Figure 7:
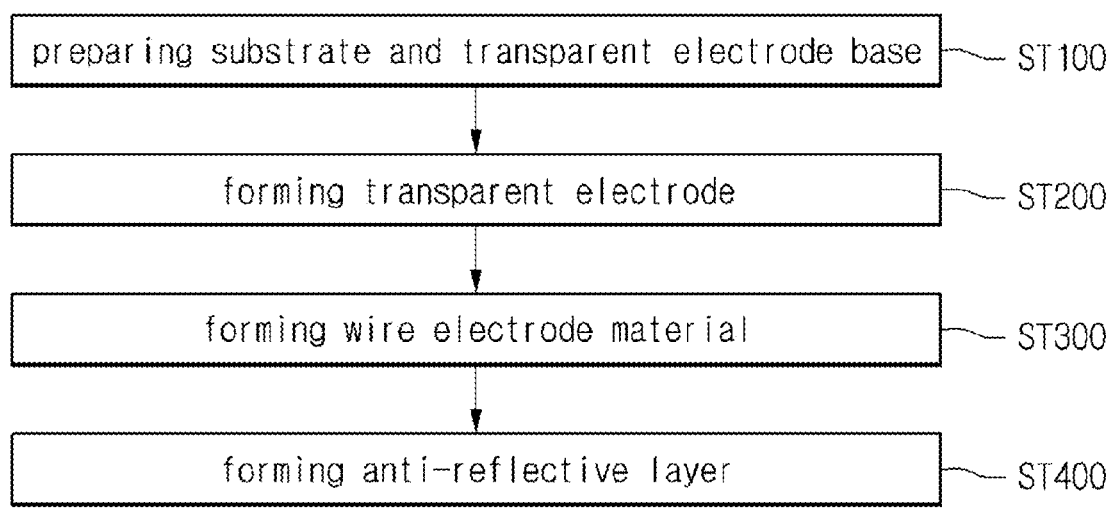
FIG. 7 is a flowchart showing a method for manufacturing a touch panel according to an embodiment of the subject invention.

FIG. 7 is a flowchart showing a method for manufacturing a touch panel according to an embodiment of the subject invention.

Referring to FIG. 7, a method for manufacturing a touch panel according to an embodiment of the subject invention can include one or more of: a step of preparing a substrate and a transparent electrode base (step ST100); a step of forming a transparent electrode (step ST200); a step of forming a wire electrode material (step ST300); and a step of forming an anti-reflective layer (step ST400).

In the step of preparing the substrate and the transparent electrode base (step ST100), the substrate can be prepared, and the transparent electrode base can include, e.g., a PET film, though embodiments are not limited thereto. In an embodiment, the substrate can have a curved surface.

Thereafter, in the step of forming the transparent electrode (step ST200), the transparent electrode can be formed on the transparent electrode base. The step of forming the transparent electrode (step ST200) can include a step of forming a first transparent electrode extending in a first direction and a second transparent electrode extending in a second (e.g., a direction different from the first direction, such as a direction to cross the first transparent electrode).

Referring to FIGS. 3 and 5, the step of forming the transparent electrode (step ST200) can further include a step of forming the first and second transparent electrodes 32 and 34 in line with the transparent electrode base 70, and a step of forming the insulating layer 50 between the first and second transparent electrodes 32 and 34.

In an embodiment, the first and second transparent electrodes 32 and 34 can be formed through a deposition scheme. For example, the first and second transparent electrodes 32 and 34 can be formed through a reactive sputtering scheme. In this case, when the first and second transparent electrodes 32 and 34 include an indium tin oxide, the first and second transparent electrodes 32 and 34 can include 10% or less of tin (Sn). Accordingly, the transmittance can be improved. Thereafter, the electrical conductivity can be improved by crystallizing an indium tin oxide through an annealing process. However, the embodiment is not limited thereto, and the first and second transparent electrodes 32 and 34 can be formed through various schemes.

The step of forming the insulating layer 50 can include a step of coating an insulating material, and the insulating material can include, e.g., an organic material, though embodiments are not limited thereto. In the step of coating the insulating material, wet coating can be achieved. In this case, the insulating material can include polymer or acrylic resin.

In an embodiment, the step of forming the insulating layer can include a step of depositing an insulating material, and the insulating material can include an inorganic material. For example, the insulating material can include a silicon nitride (SiNx) or a silicon oxide (SiO2), though embodiments are not limited thereto.

The step of forming the wire electrode material (step ST300) can be performed on the transparent electrode base. In the step of forming the wire electrode material (step ST300), the wire electrode material can be deposited in the same manner that the transparent electrode is formed as described above. For example, the wire electrode material can be deposited through a sputtering scheme or a reactive sputtering scheme, though embodiments are not limited thereto. When a wire electrode is formed through a reactive sputtering scheme, the wire electrode can be deposited using an atmosphere of, for example, oxygen or nitrogen.

The wire electrode material can include, for example, chrome (Cr), aluminum (Al), silver (Ag), copper (Cu), nickel (Ni), molybdenum (Mo), and/or any alloy thereof, though embodiments are not limited thereto.

For example, the wire electrode material can include a Cr oxide, an Al oxide, an Ag oxide, a Cu oxide, an Ni oxide, and an Mo oxide.

In an embodiment, after performing the step of forming the wire electrode material (step ST300), a step of forming the wire electrode by etching the wire electrode material can be further performed. In more detail, the wire electrode material can be etched through a wet etching scheme. The wet etching scheme can be performed by using a chemical, and is a technology in which components contained in the chemical chemically react to a material to be etched so that the component to be etched is melted in the chemical for the etching purpose. For example, the etching process can be performed by using a FeCl₃ solution or a NaOH solution, though embodiments are not limited thereto.

A wire electrode having a thin line width can be formed through the wet etching scheme. For example, the line width of the wire electrode may be in the range of 10 μm to 100 μm, though embodiments are not limited thereto.

In the step of forming the wire electrode material (step ST300), the wire electrode can be formed through a simple printing process. For example, the wire electrode can be formed through a direct printing process.

According to certain embodiments, a narrow dummy area can be realized by forming a line width of the wire electrode at a thin thickness. For example, the dummy area DA (see FIG. 1) can be formed in the size of about 2 mm, so that the effective area AA (see FIG. 1) of the touch panel and various designs can be ensured. In addition, since the wire electrode has a thin line width, many wire electrodes can be formed in the dummy area DA, so that the resolution of the touch panel can be increased.

Thereafter, in an embodiment, the step of forming the anti-reflective layer (step ST400) can include a step of coating an anti-reflective material.

Referring to FIGS. 3 and 4, the anti-reflective layer 80 can be formed through a coating scheme, so that the anti-reflective layer 80 can densely make contact with the transparent electrode base 70. Accordingly, the thickness of the touch panel can be reduced.

However, the embodiment is not limited thereto. For example, the step of forming the anti-reflective layer (step ST400) can include a step of forming the anti-reflective film.

Referring to FIGS. 5 and 6, the anti-reflective film can be formed on the bottom surface of the transparent electrode base 70.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A touch panel comprising:
a transparent electrode base;
a first electrode disposed on the transparent electrode base and extending in a first direction;
a second electrode disposed on the transparent electrode base and extending in a second direction;
an insulating layer disposed between the first electrode and the second electrode;
a first wire electrode connected to the first electrode, and provided on the transparent electrode base;
a second wire electrode connected to the second electrode, and provided on the transparent electrode base;
a substrate disposed on the transparent electrode base;
an outer dummy layer disposed on the first wire electrode and the second wire electrode;
an optically clear adhesive (OCA) interposed between the substrate and the transparent electrode base,
wherein the OCA covers the first wire electrode, the second wire electrode, the first electrode, and the second electrode;
wherein the substrate comprises at least one curved surface,
wherein each of the first wire electrode and the second wire electrode has a line width in a range of from about 10 μm to about 100 μm,
wherein the substrate includes an effective area and a dummy area,
wherein the outer dummy layer is disposed on the dummy area, and
wherein a width of the dummy area is less than 2 mm.

2. The touch panel of claim 1, further comprising an anti-reflective layer provided on the transparent electrode base.

3. The touch panel of claim 1, wherein the second electrode is in direct physical contact with the transparent electrode base.

4. The touch panel of claim 1, wherein the substrate comprises a first curved surface and a second curved surface opposite to the first curved surface.

5. The touch panel of claim 1, wherein the substrate comprises at least two curved surfaces.

6. The touch panel of claim 1, wherein the first electrode is in direct physical contact with the transparent electrode base.

7. The touch panel of claim 1, wherein the transparent electrode base is disposed on at least one of the curved surfaces of the substrate.

8. The touch panel of claim 1, wherein the second electrode is in direct physical contact with the transparent electrode base.

9. The touch panel of claim 1, wherein each of the first electrode and the second electrode comprises at least one of the following materials: indium tin oxide; indium zinc oxide; copper oxide; tin oxide; zinc oxide; titanium oxide; carbon nano tube (CNT); and conductive polymer material.

10. The touch panel of claim 1, wherein each of the first wire electrode and the second wire electrode comprises at least one of the following materials: chromium (Cr); aluminum (Al); silver (Ag); copper (Cu); nickel (Ni); and molybdenum (Mo).

11. The touch panel of claim 1, wherein the first electrode includes a pair of first sensor parts and a first connection part connecting the first sensor parts to each other,
wherein the second electrode includes a pair of second sensor parts and a second connection part connecting the second sensor parts to each other,
wherein the first connection part connects the first sensor parts in the first direction, and the second connection part connects the second sensor parts in the second direction, and
wherein the insulating layer is disposed between the first connection part and the second connection part.

12. The touch panel of claim 1, wherein the insulating layer includes at least one of silicon oxide, polymer, and acrylic resin.

13. The touch panel of claim 1, further comprising a printed circuit board connected to the first and second wire electrodes,
wherein the first wire electrode, the second wire electrode, and the printed circuit board are disposed on the dummy area.

14. The touch panel of claim 1, further comprising a scattering prevention film on the first wire electrode, the second wire electrode, the first electrode, and the second electrode;
wherein the scattering prevention film covers the first wire electrode, the second wire electrode, the first electrode, and the second electrode.

15. The touch panel of claim 1, wherein the insulating layer includes an organic material.

16. The touch panel of claim 1, wherein the insulating layer includes at least one of a silicon nitride (SiNx) and a silicon oxide ($SiO_2$).

17. The touch panel of claim 1, wherein the first direction and second direction cross each other.

18. The touch panel of claim 1, wherein the substrate includes a surface which is touched by an input device.

19. A display device comprising the touch panel according to claim 1.

20. The touch panel of claim 1, wherein the substrate comprises glass.

\* \* \* \* \*